(12) United States Patent
Roper et al.

(10) Patent No.: US 12,733,489 B2
(45) Date of Patent: Sep. 8, 2026

(54) THERMAL MANAGEMENT ARCHITECTURE FOR THREE-DIMENSIONAL HETEROGENEOUS INTEGRATED LAYERS

(71) Applicant: HRL LABORATORIES, LLC, Malibu, CA (US)

(72) Inventors: Christopher Roper, Oak Park, CA (US); Souheil Nadri, Lake Balboa, CA (US); Christina M. Seeholzer, Woodland Hills, CA (US); Adam Gross, Santa Monica, CA (US); John H. Martin, Vienna, VA (US)

(73) Assignee: HRL LABORATORIES, LLC, Malibu, CA (US)

( * ) Notice: Subject to any disclaimer, the term of this patent is extended or adjusted under 35 U.S.C. 154(b) by 364 days.

(21) Appl. No.: 18/391,070

(22) Filed: Dec. 20, 2023

(65) Prior Publication Data

US 2025/0210441 A1 Jun. 26, 2025

(51) Int. Cl.

| | |
|---|---|
| ***H10W 40/22*** | (2026.01) |
| ***H01Q 1/02*** | (2006.01) |
| ***H01Q 1/22*** | (2006.01) |
| ***H01Q 9/04*** | (2006.01) |
| ***H01Q 21/06*** | (2006.01) |
| ***H04B 1/036*** | (2006.01) |
| ***H04B 1/40*** | (2015.01) |
| ***H10W 40/25*** | (2026.01) |
| ***H10W 40/47*** | (2026.01) |

(Continued)

(52) U.S. Cl.

CPC .............. *H10W 40/22* (2026.01); *H01Q 1/02* (2013.01); *H01Q 1/2283* (2013.01); *H01Q 9/0407* (2013.01); *H01Q 21/065* (2013.01); *H04B 1/036* (2013.01); *H04B 1/40* (2013.01); *H10W 40/25* (2026.01); *H10W 40/47* (2026.01); *H10W 40/778* (2026.01); *H10W 44/20* (2026.01); *H10W 90/00* (2026.01); *H10W 44/241* (2026.01)

(58) Field of Classification Search

CPC ...... H04B 1/036; H10W 40/47; H01Q 1/2283

See application file for complete search history.

(56) References Cited

U.S. PATENT DOCUMENTS 8,456,017 B2 6/2013 Dai et al.

FOREIGN PATENT DOCUMENTS

CN 113300072 A * 5/2021

OTHER PUBLICATIONS

Lu, J.Q., "3-D Hyperintegration and Packaging Technologies for Micro-Nano Systems," Proceedings of the IEEE, vol. 97, No. 1, pp. 18-30, Jan. 2009, doi: 10.1109/JPROC.2008.2007458.

(Continued)

*Primary Examiner* — Matthew L Reames

(74) *Attorney, Agent, or Firm* — Lewis Roca Rothgerber Christie LLP

(57) ABSTRACT

A three-dimensional heterogeneous integrated (3DHI) package includes: a plurality of electrically interconnected active layers stacked on each other and a cooling block at a lower end of the active layers. Each of the active layers includes a semiconductor element, and at least one of the active layers includes an embedded heat spreader. The cooling block has a plurality of cooling channels formed therein, and the cooling channels do not extend through any of the active layers.

9 Claims, 7 Drawing Sheets

(51) Int. Cl.
*H10W 40/77* (2026.01)
*H10W 44/20* (2026.01)
*H10W 90/00* (2026.01)

(56) References Cited

OTHER PUBLICATIONS

Herd, J.S. et al., "The Evolution to Modern Phased Array Architectures," in Proceedings of the IEEE, vol. 104, No. 3, pp. 519-529, Mar. 2016, doi: 10.1109/JPROC.2015.2494879.
Van Erp, R. et al., Co-designing electronics with microfluidics for more sustainable cooling, Nature 2020—silicon microchannels; 42 pages, https://www.nature.com/articles/s41586-020-2666-1.
Hazra, S., et al., "A Novel Hardmask-to-Substrate Pattern Transfer Method for Creating 3D, Multi-level, Hierarchical, High aspect-ratio Structures for Applications in Microfluidics and Cooling," *Scientific Reports* (12) #12180 (2022).
Jung, K. W. et al., "Embedded Cooling with 3D-Manifold for Vehicle Power Electronics," International Journal of Heat and Mass Transfer, (130), pp. 1108-1119 (2019).
Fan S.K., et al., "MEMS with thin-film aerogel" Mechanical and Aerospace Engineering and Aerospace Engineering Department, University of California, Los Angeles, (UCLA), IEEE, 2001, 4 pages https://ieeexplore.ieee.org/abstract/document/906494 this uses a thin film of aerogel. Our invention inserts aerogel into etched cavities.
Islamov, M., et al., "High-throughput screening of hypothetical metal-organic frameworks for thermal conductivity", Computational Materials, www.nature.com/npicompumats; 2023 2 pages https://doi.org/10.1038/s41524-022-00961-x.

* cited by examiner

THERMAL MANAGEMENT ARCHITECTURE FOR THREE-DIMENSIONAL HETEROGENEOUS INTEGRATED LAYERS

CROSS-REFERENCE TO RELATED APPLICATION

The present disclosure is related to U.S. patent application Ser. No. 18/454,755, filed on Aug. 23, 2023.

FIELD

One or more aspects of embodiments of the present disclosure relate to a thermal management architecture for three-dimensional heterogeneous integrated (3DHI) layers.

BACKGROUND

Three-dimensional heterogeneous integrated (3DHI) technology refers to the ability to stack (e.g., vertically stack) differently manufactured components within a single, compact package. The different components, which form the layers of the 3DHI stack, may be manufactured in different facilities with different processes and often have different functions. 3DHI stacks can include various numbers of layers, such as three or more, five or more, ten or more, 16 or more, etc., depending on their application. However, 3DHI stacks can be difficult to cool due to their small size and vertical stacking arrangement. Insufficient cooling is particularly problematic in high-power 3DHI components, such as those used in radio frequency front ends.

A radio frequency front end (often abbreviated as RF front end or RFFE) refers to the circuitry that exists near and, depending on the particular arrangement, may include, a receiver's antenna input and converts the received radio frequency signal to a lower intermediate frequency for further processing. Often, the RF front end includes all circuitry between the antenna or antenna(s) and a mixing stage of a receiver. Further, in the case of a transceiver, the RF front end can also control switching between transmitting and receiving operations. The components of the RF front end are often arranged at or very near to the base of the antenna or antennas (e.g., may be directly under the antenna or antennas) to improve packaging and to avoid signal degradation.

An RF front end may include an RF filter (e.g., a band-pass filter) that receives the electromagnetic waves from the antenna and filters out (e.g., removes) out-of-band signals, an RF amplifier to amplify weak signals without introducing or exacerbating noise, a local oscillator to generate a radio frequency signal that is the same as or close to the input signal, and a mixer that provides a signal at a desired frequency by mixing the electromagnetic wave signal from the antenna (and from the other components of the RF front end) with the generated radio frequency signal from the local oscillator. The frequency output from the mixer is referred to as the intermediate frequency, which is further processed for use by the device.

RF front ends are present in all manner of electronic devices that send and receive RF signals, from personal cell phones to industrial microwave communication systems and military radar systems. While relatively low power devices (e.g., smartphones, Internet of Things (IoT) devices, Wi-Fi routers, etc.) can rely on passive cooling for their respective RF front ends, relatively high power devices (e.g., commercial communication systems and military and commercial radar systems) often use active thermal management solutions to ensure adequate performance and to avoid component damage.

SUMMARY

According to embodiments of the present disclosure, a thermal management architecture for a three-dimensional heterogeneous interpreted (3DHI) layer stack is provided. In some embodiments, the 3DHI layer stack may be a radio frequency (RF) front end. The RF front end includes a plurality of active layers, which may be formed by using a 3D Heterogeneous Integration (3DHI) process, arranged between two passive layers, a microchannel cooling block at a lower end and an antenna layer at an upper end. The microchannel cooling block and the antenna layer receive a liquid coolant, which flows there through, to cool the RF front end in conjunction with a pump and radiator. The radiator may be a liquid to air heat exchanger, a liquid to liquid heat exchanger, a liquid to phase change heat exchanger, or a liquid to radiative (e.g., emissive) cooling panels, which can be particularly well suited to space-based applications. The cooling system may further include one or a plurality of heat pipes between the liquid cooling loops and the radiator, regardless of radiator type, to efficiently facilitate heat transfer.

The coolant does not flow into or through channels in the active layers, instead heat is passively conducted through the active layers to the actively cooled passive layers. To facilitate this passive heat conduction through the active layer stack, one or more of the active layers may include an embedded heat spreader. One or more others of the active layers may include embedded thermal isolators to protect thermally sensitive components. In this way, heat is efficiently conducted vertically through the active layer stack, with the heat spreader avoiding the formation of hot spots and the thermal isolator preventing the more heat-sensitive components of the RF front end from being overheated.

According to an embodiment of the present disclosure, a three-dimensional heterogeneous integrated (3DHI) package includes: a plurality of electrically interconnected active layers stacked on each other, each of the active layers includes a semiconductor element, and at least one of the active layers includes an embedded heat spreader; and a cooling block at a lower end of the active layers. The cooling block has a plurality of cooling channels formed therein, and the cooling channels do not extend through any of the active layers.

At least another one of the active layers may include an embedded thermal isolator.

The embedded thermal isolator may include an aerogel.

The aerogel may be a silica aerogel or a silica xerogel.

The 3DHI package may further include an uppermost layer at an upper end of the active layers. The uppermost layer may have a plurality of cooling channels formed therein. The cooling block may be in fluid communication with the uppermost layer via interlayer passages extending therebetween, and the interlayer passages may be spaced from the active layers.

The cooling block may include an inlet and an outlet configured for fluid communication between the cooling channels in the cooling block and a heat exchanger.

The embedded heat spreader may include one or more metals from among copper, tungsten, and molybdenum, one or more high thermal conductivity components from among diamond, silicon carbide, boron nitride, aluminum nitride, silicon, graphite, graphene, carbon nanotubes, boron nitride nanotubes, or a copper-molybdenum-diamond composite material.

Two of the active layers may be a power amplifier layer and a beam forming layer, respectively.

Each of the power amplifier layer and the beam forming layer may have a thickness in a range of 20 μm to 150 μm.

The active layers may further include at least one of a digital signal processing layer or a memory layer.

According to another embodiment of the present disclosure, a radio frequency (RF) front end includes: a plurality of electrically interconnected active layers stacked on each other; and an antenna on an upper surface of the active layers. The antenna includes a plurality of antenna elements on an upper surface thereof to form a phased array antenna, and the antenna elements are electrically connected to the active layers via coaxial RF feeds. The antenna includes a plurality of microchannels in a microchannel layer and a RF dielectric layer between the antenna elements and the microchannel layer, and the coaxial RF feeds extend through the microchannel layer.

Surfaces of the microchannels may be coated with a metal.

The antenna may further include an RF shielding layer that surrounds a periphery of the coaxial RF feeds.

The RF front end may further include a cooling block on a lower surface of the active layer and having a plurality of microchannels therein.

The microchannels in the antenna may be in fluid communication with the microchannels in the cooling block via interlayer passages, and the interlayer passages may extend along the active layers and may be closed from the active layers.

The active layers may include: a power amplifier layer; and a beam forming layer. At least one of the active layers may include an embedded heat spreader and at least another one of the active layers may include an embedded thermal isolator.

The embedded heat spreader may include one or more metals from among copper, tungsten, and molybdenum, one or more high thermal conductivity components from among diamond, silicon carbide, boron nitride, aluminum nitride, silicon, graphite, graphene, carbon nanotubes, boron nitride nanotubes, or a copper-molybdenum-diamond composite material.

The embedded thermal isolator may include an aerogel.

The active layers may further include a digital signal processing layer and a memory layer.

According to another embodiment of the present disclosure, a method of manufacturing a radio frequency (RF) front end includes: forming a plurality of active layers, each of the active layers including a substrate; stacking the active layers on each other and electrically interconnecting the active layers using through substrate vias; arranging the stacked active layers on a cooling block; and arranging an antenna layer on the active layers opposite the cooling block.

The forming of the active layers may further include: etching a bottom surface of at least one of the active layers to form a cavity; and depositing a thermally conductive material into the cavity in the at least one of the active layers.

The thermally conductive material may include one or more metals from among copper, tungsten, and molybdenum, one or more high thermal conductivity components from among diamond, silicon carbide, boron nitride, aluminum nitride, silicon, graphite, graphene, carbon nanotubes, boron nitride nanotubes, or a copper-molybdenum-diamond composite material.

The forming of the active layers may further include: etching a bottom surface of at least another one of the active layers to form a cavity; and forming a porous thermal isolator in the cavity in the at least another one of the active layers.

The porous thermal isolator may include a silica aerogel or a silica xerogel.

BRIEF DESCRIPTION OF THE DRAWINGS

These and other aspects and features of the present disclosure will be further appreciated and better understood with reference to the specification, claims, and appended drawings, in which:

DETAILED DESCRIPTION

Figure 1:
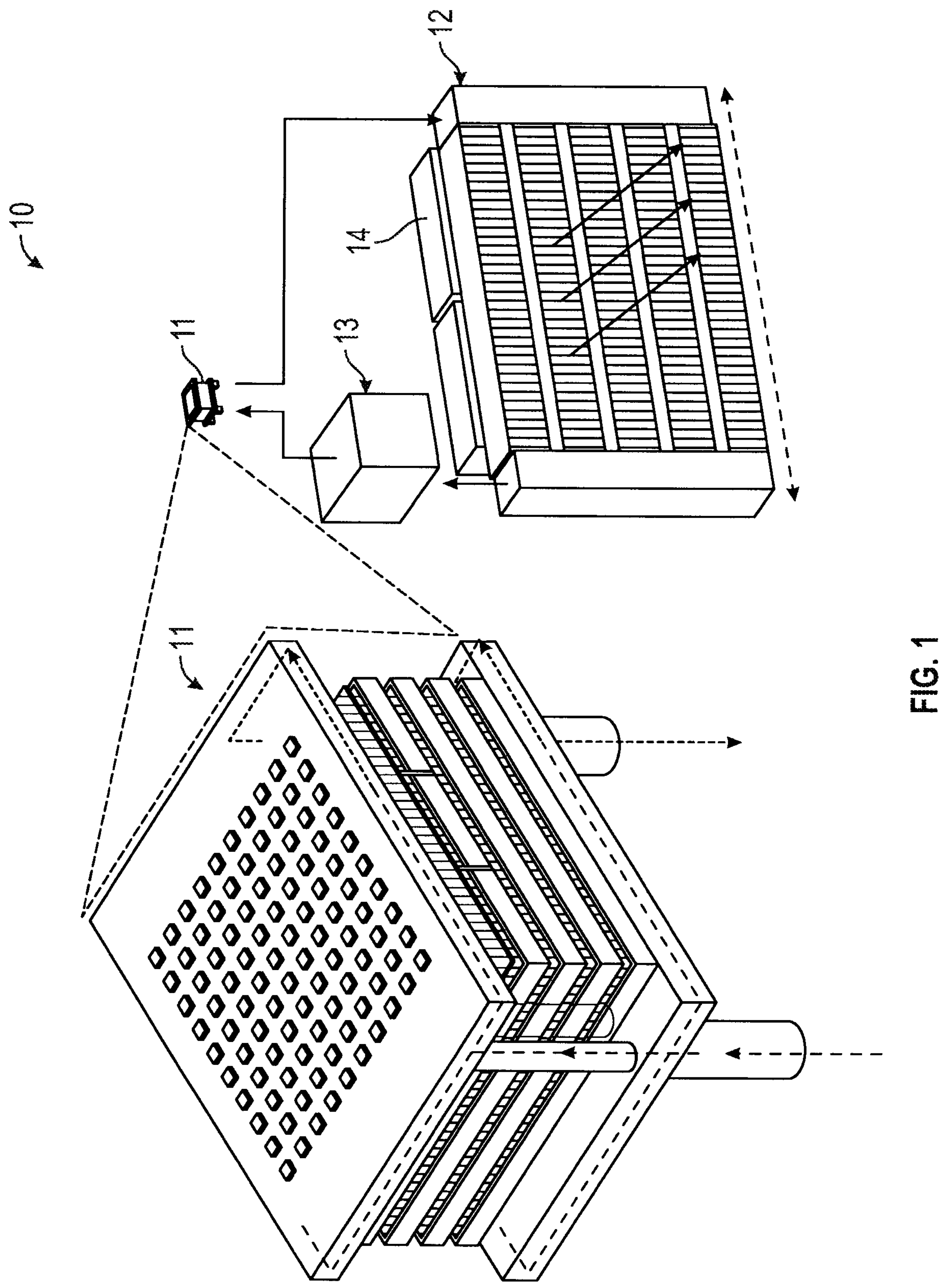
FIG. 1 is a schematic diagram of thermal management system for a radio frequency (RF) front end.

The detailed description set forth below, in connection with the appended drawings, is intended as a description of example embodiments of the present disclosure and is not intended to represent the only forms in which the present disclosure may be embodied. The description sets forth aspects and features of the present disclosure in connection with the illustrated example embodiments. It is to be understood, however, that the same or equivalent aspects and features may be accomplished by different embodiments, and such other embodiments are encompassed within the spirit and scope of the present disclosure. As noted elsewhere herein, like reference numerals in the description and the drawings are intended to indicate like elements. Further, descriptions of features, configurations, and/or other aspects within each embodiment should typically be considered as available for other similar features, configurations, and/or aspects in other embodiments.

Recently, advancements in three-dimensional packaging has resulted in the reduced size of electronic components. One type of three-dimensional packaging is referred to as three-dimensional heterogeneous integration (3DHI), which refers to the stacking (i.e., vertically stacking) of different (i.e., heterogeneous) components that are integrated together to form a single electronic component, often referred to as the "stack" or "package." The different components (e.g., the different layers or tiers) may have different wafer sizes and feature sizes on different substrates. To this end, the different components often have different thermal properties, which can result in heat being "stuck" in, or unable to be easily removed from, an intermediate layer of the stack.

One method of addressing such a problem is for each component (e.g., each layer) of the package to have an embedded cooling structure in the form of channels for the passage of a cooling fluid. However, such an arrangement requires that each layer be relatively thick to reliably accommodate the fluid channels and to provide space for connection to the external components of the cooling system (e.g., inlet and outlet plumbing, etc.).

Referring to FIG. 1, a thermal management system for three-dimensional heterogeneous integrated (3DHI) package 10, according to an embodiment of the present disclosure, is illustrated. The thermal management system (e.g., the cooling system) 10 for the 3DHI package includes the 3DHI package 11, a heat exchanger 12, and a pump 13. In this disclosure, the 3DHI package 11 is shown as being a radio frequency (RF) front end 11, but the present disclosure is not limited thereto, and any 3DHI package may be used in place of the RF front end 11.

A liquid coolant may flow through a cooling structure of (e.g., passages in) the RF front end 11 to the heat exchanger 12 via the pump 13 to remove heat from the RF front end 11 and emit the heat to the environment via the heat exchanger 12. In the drawings, the pump 13 and the heat exchanger 12 are schematically illustrated and may include one or more pumps, one or more heat exchangers 12, other components, such as valves, accumulators, etc., and may include other, larger cooling loops.

The heat exchanger 12 may be, for example, a liquid to air heat exchanger, a liquid to liquid heat exchanger, a liquid to phase change heat exchanger, or a liquid to radiative (e.g., emissive) cooling panels, which can be particularly well suited to space-based applications. The thermal management system 10 may further include one or a plurality of heat pipes between the liquid cooling loops and the radiator, regardless of radiator type, to efficiently facilitate heat transfer. The thermal management system 10 may be a single-phase system in which the coolant remains in one phase (e.g., the liquid phase) or may be phase change system in which the liquid coolant may partially or fully evaporate inside the cooling block and/or the antenna (to be described in more detail below) and may partially or fully condense in the heat exchanger 12. However, the present disclosure is not limited thereto.

The heat exchanger 12 is illustrated as being a liquid-air heat exchanger including a fan 14 to increase airflow there through to improve heat transfer, but the heat exchanger 12 may be a liquid-liquid heat exchanger. In some embodiments, the heat exchanger 12 may be a high fin density copper (Cu) liquid-to-air heat exchanger. In some embodiments, a plurality of the RF front ends 11 may be in fluid communication with a single heat exchanger 12. In some embodiments, the heat exchanger 12 may be part of an air cycle machine (ACM). In one embodiment, the heat exchanger 12 has a length between its inlet and outlet of about 50 cm (e.g., the coolant flow passages through the heat exchanger 12 may be about 50 cm long), but the present disclosure is not limited thereto.

Figure 2:
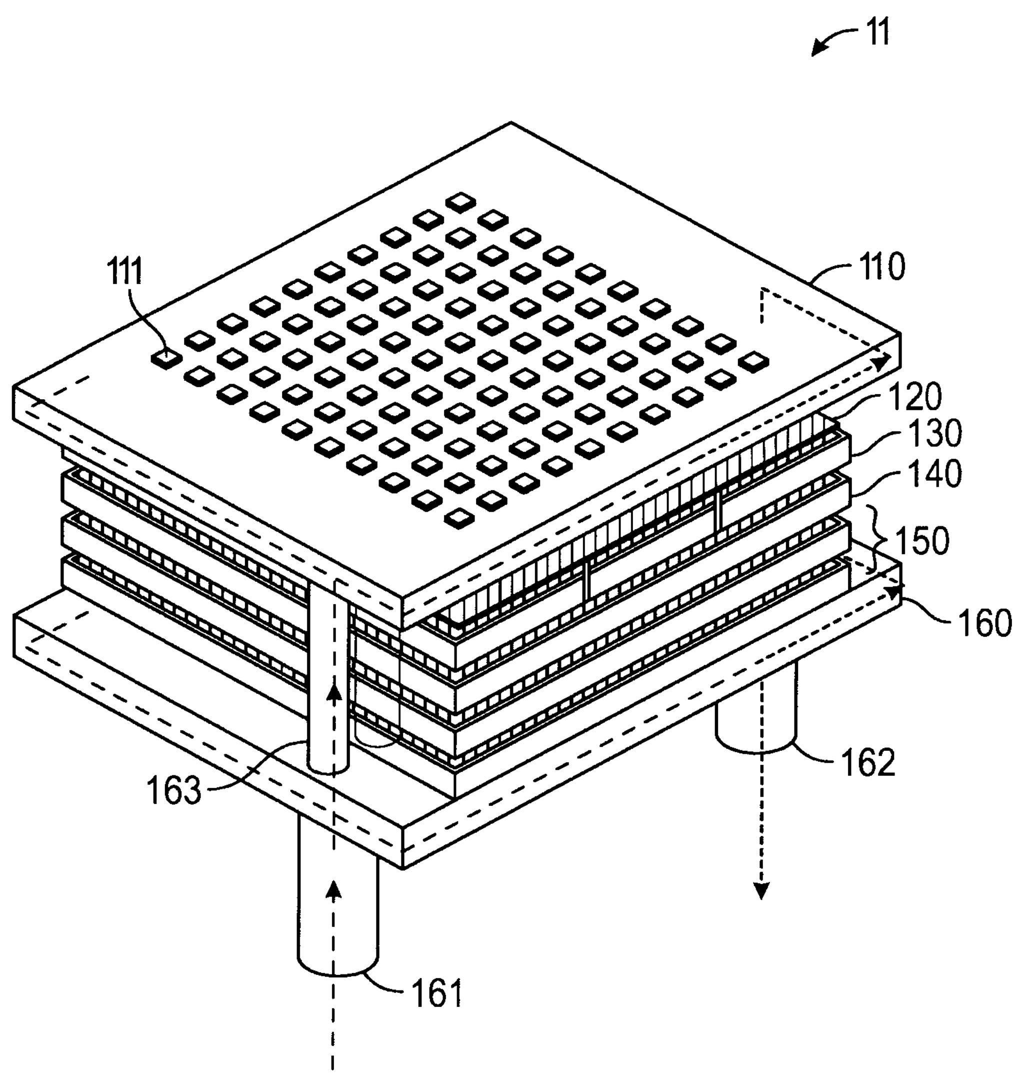
FIG. 2 is a perspective view of the RF front end shown in FIG. 1.

FIG. 2 shows an enlarged view of the RF front end 11 shown in FIG. 1. Hereinafter, the RF front end 11 will be described as a phased array 3D Heterogeneous Integrated (3DHI) RF front end, but the present disclosure is not limited thereto. Referring to FIG. 2, the RF front end 11, according to an embodiment of the present disclosure, includes an uppermost layer (e.g., an antenna layer (or tier) or a passive antenna layer) 110, a power amplifier layer 120, a beam forming layer (e.g., a beam forming integrated circuit layer) 130, a digital signal processing (DSP) layer 140, a memory layer 150, and a microchannel cooling block 160 sequentially stacked in that order. In the illustrated embodiment, the memory layer 150 is illustrated as including two layers, but the present disclosure is not limited thereto. Indeed, in various embodiments, the number of each layer 120-150 may be suitably varied or ones of the layers 120-150 may be omitted. In the illustrated embodiment, the layers 120-150 are referred to as "active layers" or "active tiers," and the RF front end 11 includes five active layers 120-150. Each of the active layers 120-150 may include a substrate, such as a silicon (Si) or silicon carbide (SiC) substrate, with various semiconductors formed thereon and/or therein configured to perform their respective functions. Although not shown, the RF front end 11 may further include passive layers, referred to as passive interposers, that can be used for electrical routing or heat spreading or insulation as will be better understood later.

The microchannel cooling block 160 is a bottommost layer of the RF front end 11 and acts as a cooling plate for the RF front end stack (e.g., the 3DHI stack) arranged or formed thereon. For example, the active layers 120-150 of the RF front end 11 may be formed by using a three-dimensional heterogeneous integration (3DHI) manufacturing method, and the active layers 120-150 (e.g., the stack) may then be arranged on the microchannel cooling block 160. The active layers 120-150 may be adhered to the microchannel cooling block 160 by using an adhesive or a solder, for example. However, the present disclosure is not limited thereto.

Figure 6:
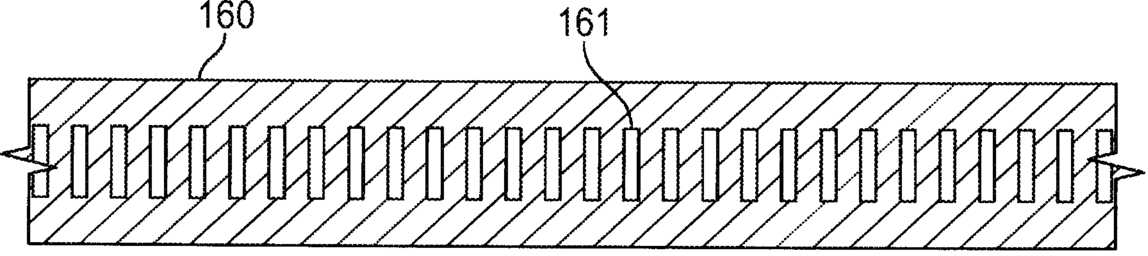
FIG. 6 is a cross-sectional view of a microchannel cooling block shown in FIG. 2 according to an embodiment.

In some embodiments, the microchannel cooling block 160 may include a plurality of microchannels 161 formed therein (see, e.g., FIG. 6). In other embodiments, the microchannel cooling block 160 may be partially formed in the bottom of the bottom-most active layer 150. For example, a lower surface of the bottom-most active layer 150 may be etched, for example, by deep reactive ion etching, to form microchannels in the substrate (e.g., a silicon substrate) of the active layer 150. Then, the microchannels in the bottom-most active layer 150 may be aligned with the microchannels 161 in the microchannel cooling block 160 when the microchannel cooling block 160 and the active layer 150 are coupled together.

In another embodiment, the microchannel cooling block 160 could be formed in the back of a passive interposer arranged between the active layer 150 (e.g., the bottom-most active layer) and a lower substrate.

The microchannel cooling block 160 may be (or may include) a copper-molybdenum (Cu—Mo) composite material and, in some embodiments, may have electrical connection routings extending vertically through it to the active layers 120-150.

In some embodiments, the microchannel cooling block 160 may have a Cu—Mo base with copper (Cu) fins extending therefrom. In such embodiments, the Cu—Mo base may have a coefficient of thermal expansion (CTE) that matches or substantially matches that of the bottommost layer from among the active layers 120-150, which is the memory layer 150 in the illustrated embodiment, to reduce or minimize thermal stress within the RF front end stack. The microchannels 161 within the microchannel cooling block 160 may be defined by fins and may each have a width in a range of about 5 μm to about 1 mm wide. In some embodiments, each of the microchannels 161 may have width in a range of about 5 μm to about 200 μm or in a range of about 15 μm to about 50 μm. The fins of the microchannel cooling block 160 that define the microchannels 161 may have a width in a range of 5 μm to about 1 mm wide. In some embodiments, each of the finds may have width in a range of about 10 μm to about 200 μm or in a range of about 15 μm to about 50 μm. Such dimensions can provide high surface contact area and high local heat transfer coefficients. An example of the microchannel cooling block 160 and manufacturing methods thereof is described in related U.S.

application Ser. No. 18/454,755, titled Microchannel Cooling Block and Cooling Structure Including The Same, filed on Aug. 23, 2023, the entire content of which is incorporated herein. The microchannel cooling block 160 may also include a manifold layer, similar to the manifold layer 113 in the antenna layer 110, described below, which parallelizes the coolant flow and reduces microchannel flow length.

However, the present disclosure is not limited to the Cu—Mo composite cooling block and may be, in other embodiments, a microchannel cooling block made of another material, such as silicon (Si), a jet impingement cooler, another type of liquid cooling block, or even an air cooled heat sink.

The memory layer 150 may be arranged on or formed on an upper surface of the microchannel cooling block 160. The memory layer 150 may include one or more layers of semiconductor material, such as silicon (Si), and includes semiconductor devices thereon and/or therein. For example, in the illustrated embodiment, the memory layer 150 includes two layers of semiconductor material (e.g., silicon).

The DSP layer 140 may be arranged on or formed on an upper surface of the memory layer 150. The DSP layer 140 may include one or more layers of semiconductor material, such as silicon (Si), and includes semiconductor devices thereon and/or therein. For example, in the illustrated embodiment, the DSP layer 140 includes one layer of semiconductor material (e.g., silicon).

The beam forming layer 130 may be arranged on or formed on an upper surface of the DSP layer 140. The beam forming layer 130 may include one or more layers of semiconductor material, such as silicon (Si), and includes semiconductor devices thereon and/or therein. For example, in the illustrated embodiment, the beam forming layer 130 includes one layer of semiconductor material (e.g., silicon).

The power amplifier layer 120 may formed arranged on or formed on an upper surface of the beam forming layer 130. The power amplifier layer 120 may include one or more layers of semiconductor material, such as gallium nitride (GaN), silicon carbide (SiC), or silicon (Si). For example, in the illustrated embodiment, the power amplifier layer 120 includes one layer of semiconductor material (e.g., GaN). The power amplifier layer 120 is configured to power the antenna layer 110, discussed in more detail below. In some embodiments, the power amplifier layer 120 may include a plurality of power semiconductors (or power amplifiers), such as GaN power semiconductors, which are well suited to high-power applications.

The antenna layer 110 may be arranged on or formed on an upper surface of the power amplifier layer 120. The antenna layer 110 may include a plurality of antennas (e.g., antenna elements) 111 on a substrate. The antennas 111 may be arranged to form a phased array antenna. For example, the antenna layer 111 may be configured for millimeter-wave (mm-wave) and sub-terahertz (sub-THz) signals, which are increasingly being used in high-end commercial and military applications and provide exceptional bandwidth and can employ multiple beams concurrently (or simultaneously) to improve jamming resistance and interception resilience. The number, spacing, and arrangement of the antennas 111 is determined based on the wavelength of signals to be sent and received (e.g., mm-wave and/or sub-THz signals), and the present disclosure is not limited. For example, an antenna layer 110 optimized for 94 GHz wavelength signals that is 3 cm by 3 cm (length by width) may include about 400 antennas, each receiving signals from a power semiconductor in the power amplifier layer 120. Thus, the amount of power emitted by the antennas 111 across a relatively small area (e.g., 9 $cm^2$) can lead to localized hot spots in the antenna layer 110 and within the other layers of the RF front end stack.

Conventionally, the RF front end stack may include microchannels in each of the active layers 120-150 to facilitate cooling (e.g., liquid cooling) of each active layer 120-150. However, such a configuration requires that each layer be sufficiently thick to support microchannels and the inlet/outlet connections for the liquid coolant. Further, some layers, such as the power amplifier layer 120, may include a plurality of spaced apart power semiconductors such that there is no continuous substrate to accommodate microchannels, requiring the addition of a cooling substrate or cooling passage into the power amplifier layer 120. This can increase the cost and complexity of the RF front end stack.

According to embodiments of the present disclosure, the RF front end 11 includes microchannels (e.g., cooling channels or cooling microchannels) in (e.g., only in) the two passive layers 110 and 160 at the opposite ends of the RF front end stack (i.e., in the antenna layer 110 and the microchannel cooling block 160). Thus, the passive layers 110 and 160 are actively cooled by a liquid coolant while the active layers 120-150 are passively cooled by transferring heat vertically through the stack to one or both of the passive layers 110 and 160 for removal via the liquid coolant. In this manner, the active layers 120-150 can be manufactured without the inclusion of coolant passages and can be thinned (e.g., can be thinned to have a thickness in a range of about 20 μm to about 150 μm). Thus, the overall RF front end 11 can be made thinner and cheaper than conventional RF front ends with active cooling in each layer, and the possibility of failure is reduced due to the reduction in number of the liquid coolant channels. Further, a relatively thin RF front end 11 exhibits better thermal conduction vertically through the stack because heat has a shorter distance to travel and faster electrical signal travel resulting in lower latency because electrical interconnects between layers are shorter.

Referring to FIG. 2, the microchannel cooling block 160 includes an inlet 161 and an outlet 162, both of which are in fluid communication with the heat exchanger 12 and pump 13 (see, e.g., FIG. 1) and the microchannels 161 in the microchannel cooling block 160. The inlet 161 and outlet 162 may be on (e.g., may protrude from) a lower surface of the microchannel cooling block 160, but the present disclosure is not limited thereto.

The microchannel cooling block 160 further includes a plurality of interlayer passages 163 extending between (e.g., fluidly connecting) the microchannel cooling block 160 and the antenna layer 110. The interlayer passages 163 are separate from (e.g., are spaced from) the active layers 120-150 and allow the coolant to flow between the microchannel cooling block 160 and the antenna layer 110 without passing through the active layers 120-150 of the RF front end 11. For example, in use, the coolant may flow from an outlet of the heat exchanger 12, through the pump 13, and into the microchannel cooling block 160 via the inlet 161. Then, some of the coolant may flow through the microchannels 161 in the microchannel cooling block 160 to the outlet 162, and some of the coolant may flow through an inlet interlayer passage 163 to the antenna layer 110, through microchannels 116 and 114 in the antenna layer 110, to be described below, to an outlet interlayer passage (shown in shadow lines on the rear side of the RF front end 11 in FIG. 2) at an opposite edge of the antenna layer 110 and then out of the microchannel cooling block 160 via the outlet 162. The number and placement of the interlayer passages 163 are not limited. For example, in some embodiments, four interlayer passages 163 may be provided in the RF front end 11, with one interlayer passage 163 being at each corner thereof in the case of a rectangular RF front end. Further, in some embodiments, the interlayer passages 163 may be buried in the active layers 120-150 to extend through but without having openings into the active layers 120-150. Accordingly, the RF front end 11 is actively cooled at its top, via the antenna layer 110, and at its bottom, via the micro-channel cooling block 160, rather than at each or even some of the active layers 120-150 of the RF front end 11.

In other embodiments, the inlet interlayer passage 163 and the outlet interlayer passage may be omitted. In such an embodiment, each of the microchannel cooling block 160 and the antenna layer 110 may include an inlet and an outlet in fluid communication with the same or different cooling loops.

Figure 3A:
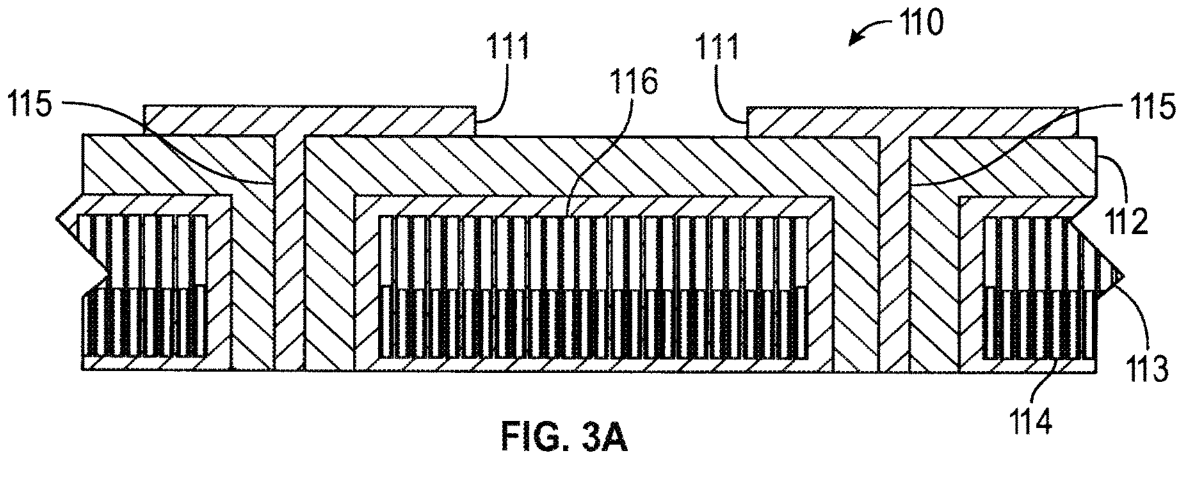
FIGS. 3A-3C are schematic cross-sectional views of various layers of the RF front end shown in FIG. 2.

Hereinafter, the layers 110-150 of the RF front end 11 will be described in more detail with reference to FIGS. 3A-5. FIG. 3A is a schematic cross-sectional view of the antenna layer 110 shown in FIG. 2 according to an embodiment of the present disclosure. Referring to FIG. 3A, the antenna layer 110 includes a dielectric layer 112, the antennas 111 on the dielectric layer 112 and including coaxial RF feeds 115 extending through the dielectric layer 112 for connection to the power amplifier layer 120, a manifold layer 113 below the dielectric layer 112, and a plurality of microchannels 114 below the manifold layer 113. The manifold layer 113 may direct (e.g., may control) the flow of the coolant through the microchannels 114 via a plurality of additional channels 116 formed therein and may be in fluid communication with the interlayer passages 163. The dielectric layer 112 may include or may be formed of a dielectric material. The coaxial RF feeds 115 may include a center conductor, an outer electrically conductive shield, and a dielectric between the center conductor and the outer electrically conductive shield. In some embodiments, the outer electrically conductive shield may be electrically grounded.

Figure 4:
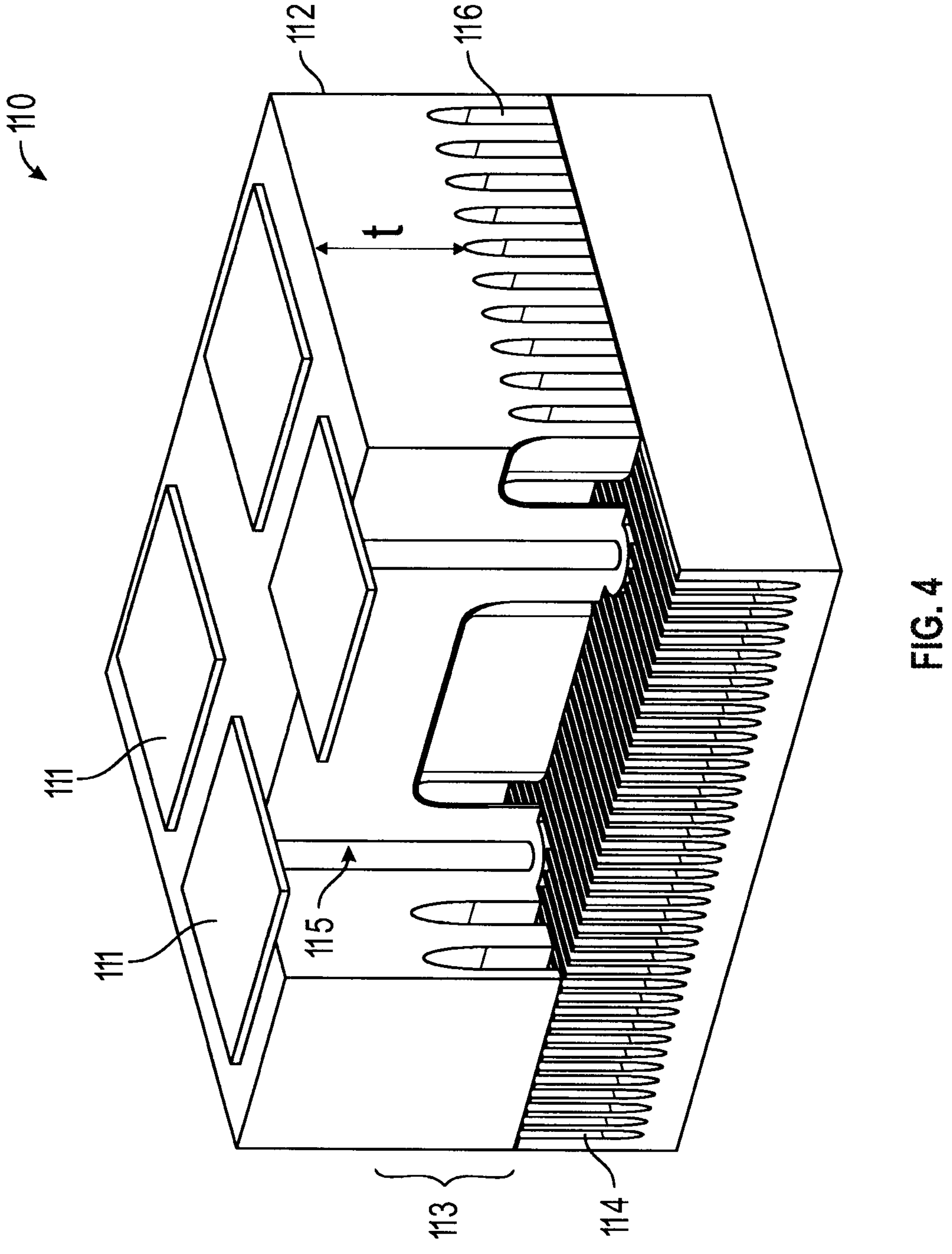
FIGS. 4 and 5 are partial cross-sectional, perspective views of an antenna layer of the RF front end shown in FIG. 2 according to various embodiments.

FIG. 4 is a partial cross-sectional, perspective view of the antenna layer 110 according to an embodiment of the present disclosure. Referring to FIG. 4, the antenna layer 110 includes the antennas 111 and the coaxial RF feeds 115, the dielectric layer 112, the manifold layer 113, and the micro-channels 114 described above with reference to FIG. 3A. Referring to FIG. 4, the additional channels 116 in the manifold layer 113 are shown. These passages 116 may control coolant flow through the microchannels 114 and may also allow coolant to approach the antennas 111. The manifold layer 113 may be a portion of (e.g., a lower portion of) the dielectric layer 112. Thus, the manifold layer 113 may be integrally formed with the dielectric layer 112 by, for example, etching. However, the present disclosure is not limited thereto, and in other embodiments, the manifold layer 113 may be separate from and attached to the dielectric layer 112.

The channels 116 and the microchannels 114 are spaced apart from the coaxial RF feeds 115 to avoid RF interference. Further, the channels 116 and/or the microchannels 114 may be surface coated with a conductive metal, such as copper (Cu), to further improve RF isolation between the coolant flowing through the channels 116 and the micro-channels 114 and the coaxial RF feeds 115. The effective antenna dielectric thickness t can be measured from an uppermost portion of the channels 116 in the manifold layer 113 to the surface of the dielectric layer 112 (e.g., to the bottom of the antennas 111) and may be in a range of about 10 μm to about 1 mm and, in some embodiments, in a range of about 50 μm to about 400 μm.

The coaxial RF feeds 115 extend through the microchannels 116 and 114 and are electrically insulated from the coolant flowing there through by the dielectric material of the dielectric layer 112, which extends around the coaxial RF feeds 115 through the manifold layer 113. Further, the microchannels 116 and 114 may be clad with a metal, such as copper (Cu) or gold (Au) by, for example, electroplating, electroless plating, evaporation, atomic layer deposition, chemical vapor deposition, sputtering, etc. Cladding the microchannels 116 and 114 with a metal may further prevent radio frequency interference between the coolant and the coaxial RF feeds 115.

Figure 5:
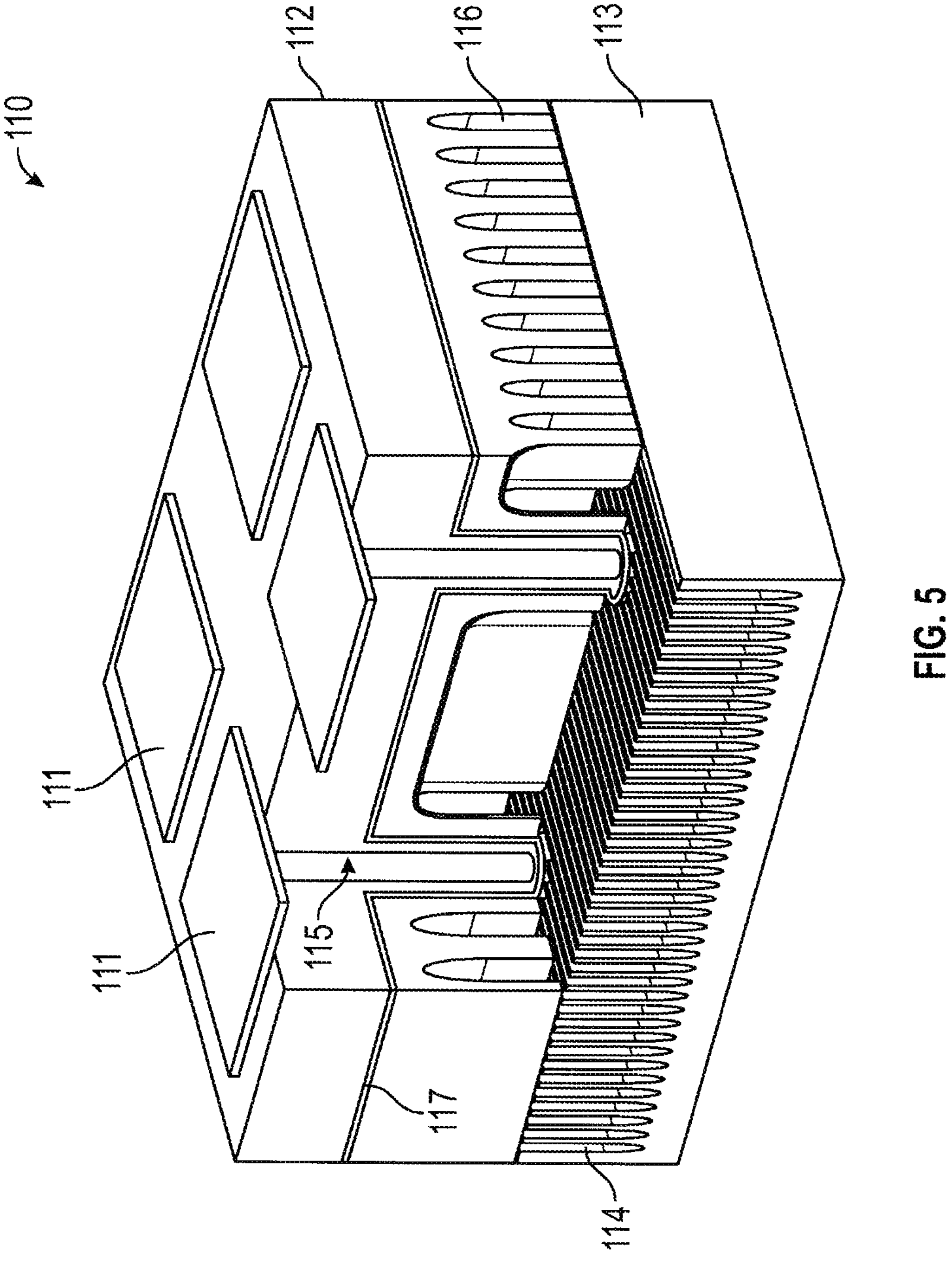

FIG. 5 is a perspective cross-sectional view of the antenna layer 110 according to another embodiment of the present disclosure. Referring to the embodiment shown in FIG. 5 in comparison with the embodiment shown in FIG. 4, the antenna layer 110 shown in FIG. 5 further includes an RF shielding layer 117 between the dielectric layer 112 and the manifold layer 113 and around (e.g., surrounding a periphery of) the coaxial RF feeds 115. The RF shielding layer 117 may be a conductive metal, such as copper (Cu), to further prevent RF interference between the coolant flowing through the microchannels 116 and 114 and the coaxial RF feeds 115. Further, the RF shielding layer 117 may be used in place of the copper cladding of the channels 116 and/or the microchannels 114 or may be used in conjunction therewith.

Figure 3B:
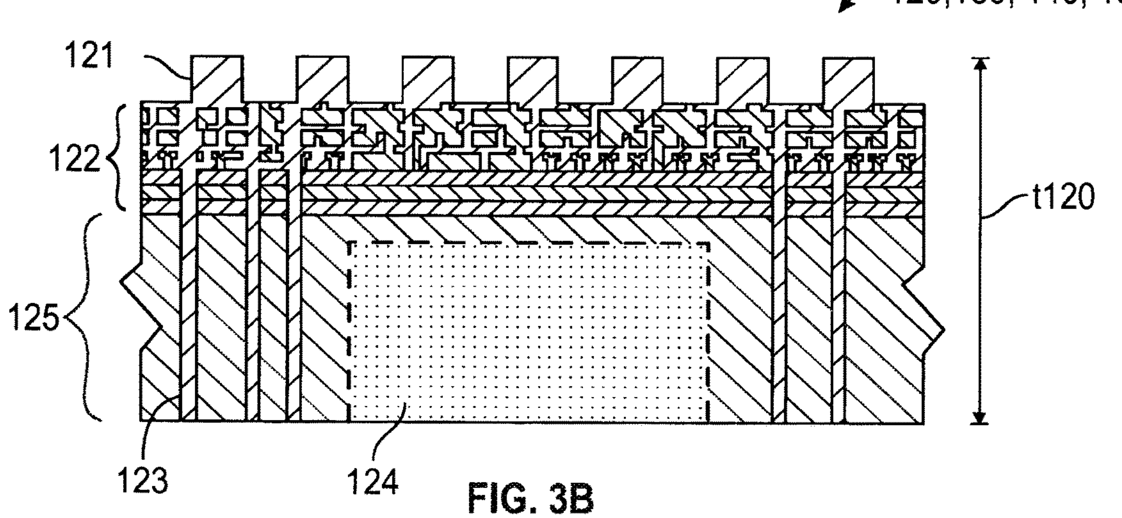

FIG. 3B is a schematic cross-sectional view of one of the active layers 120-150 shown in FIG. 2. In other words, the layer shown in FIG. 3B may represent any one or more of the active layers 120-150 and may be applied to any one or more of the active layers 120-150 shown in, for example, FIG. 2. FIG. 3B will be used to describe aspects and features of any one of the active layers 120-150 that include an embedded heat spreader 124. For convenience, FIG. 3B will be described with reference to the power amplifier layer 120, but it should be understood that the same description is applicable to any of the other active layers 120-150.

Referring to FIG. 3B, the power amplifier layer 120 (as explained above, the power amplifier layer 120 is one example, and the features described herein may apply to any of the active layers 120-150) may include metal pillars 121 extending from an upper surface thereof, semiconductor and metallization layers 122 including a plurality of semiconductor elements and back end of line (BEOL) metallization layers, which are generally metal and dielectric layers, through substrate vias 123 extending through a substrate 125, and the embedded heat spreader 124 in the substrate 125. In some embodiments or some layers, the through substrate vias 123 may be omitted. The overall thickness t120 of the power amplifier layer 120 may be in a range of about 20 μm to about 150 μm. The thickness and sizes of the various layers and elements within the power amplifier layer 120 are schematically shown and do not limit the present disclosure.

The metal pillars 121 may include or may be formed of copper (Cu), nickel (Ni), and solder, and may be formed in high areal density to improve heat conduction between layers. In some embodiments, the metal pillars 121 may also be used as electrical interconnects between layers. The metal pillars 121 may extend upwardly into (e.g., may be buried in a lower surface of) the layer above (e.g., in the case of the power amplifier layer 120, into the antenna layer 110, in particular, into the microchannels 114 in the antenna layer 110). Thus, the metal pillars 121 may help move heat from one layer toward an actively cooled layer, such as the antenna layer 110 or the microchannel cooling block 160

(e.g., in the case of the power amplifier layer 120, from the power amplifier layer 120 into the actively cooled antenna layer 110) so that the heat may be removed therefrom.

The through substrate vias (also called through-silicon vias) 123 may electrically interconnect the various active layers 120-150 of the RF front end 11 to each other and may be, for example, metal vias and may include (or may be formed of) copper (Cu).

The embedded heat spreader 124 may be entirely surrounded by the active layers 120-150 such that it is not exposed outside of the RF front end stack. For example, a lower surface of the power amplifier layer 120 may be etched to form a cavity or groove therein, and the heat spreader 124 may be formed in the cavity in the power amplifier layer 120. Then, when stacked, the exposed surface of the heat spreader 124 may contact an upper surface of the below layer (e.g., in the case of the power amplifier layer 120, the upper surface of the beam forming layer 130) to be entirely embedded in the RF front end 11.

The embedded heat spreader 124 may include (or may be formed of) copper, tungsten, and molybdenum, one or more high thermal conductivity components from among diamond, silicon carbide, boron nitride, aluminum nitride, silicon, graphite, graphene, carbon nanotubes, boron nitride nanotubes, or a copper-molybdenum-diamond composite material. The coefficient of the thermal expansion (CTE) of the heat spreader 124 may be tuned (or selected) to match or substantially match the CTE of the material of the layer in which it is formed (e.g., to match the CTE of the power amplifier layer 120 or the beam forming layer 130). For example, the CTE of the embedded heat spreader 124 may be in a range of about 2.6 ppm/K to about 8 ppm/K by varying the component percentages. However, the embedded heat spreader 124 is not limited thereto and may include other materials having a relatively low CTE, such as tungsten, in place of the molybdenum (e.g., to form a Cu—W-Diamond composite).

The embedded heat spreader 124 may be formed by using a coupled co-electrodeposition of copper and the low CTE material (e.g., molybdenum or tungsten) with electrophoretic diamond inclusions. In another embodiment, embedded heat spreader 124 may be formed by using copper electrodeposition with multi-particle (e.g., either molybdenum or tungsten with diamond) electrophoresis with surface charge control. In other embodiments, the embedded heat spreader 124 may be formed by using a chemical vapor deposition method or an electroplating method in which the different material layers are deposited in layers. To reduce or minimize reaction of the metal (e.g., molybdenum or tungsten) particles, they may be immersion coated in copper (Cu) prior to deposition and/or may be coated with a surfactant to vary the zeta potential of the particles. Similarly, the diamond particles may be coated with a metal prior to electrophoresis to improve the thermal interface conductance between the metal matrix and the diamond particles.

The embedded heat spreader 124 will absorb heat from hot spots within the respective layer in which is it formed and from other, adjacent active layers and distribute (e.g., move or conduct) the heat through the active layers 120-150 for eventual removal via the actively cooled antenna layer 110 and/or the actively cooled microchannel cooling block 160. In other words, the embedded heat spreader 124 improves through-thickness and within-layer (e.g., vertical and lateral) thermal conduction within the RF front end 11. Further, because the embedded heat spreader 124 is formed to have a CTE that is the same as or at least substantially similar to the CTE of the material of the layer in which is it formed, such as silicon, the risk of cracking is reduced and the size of the embedded heat spreader 124 can be safely increased.

Figure 3C:
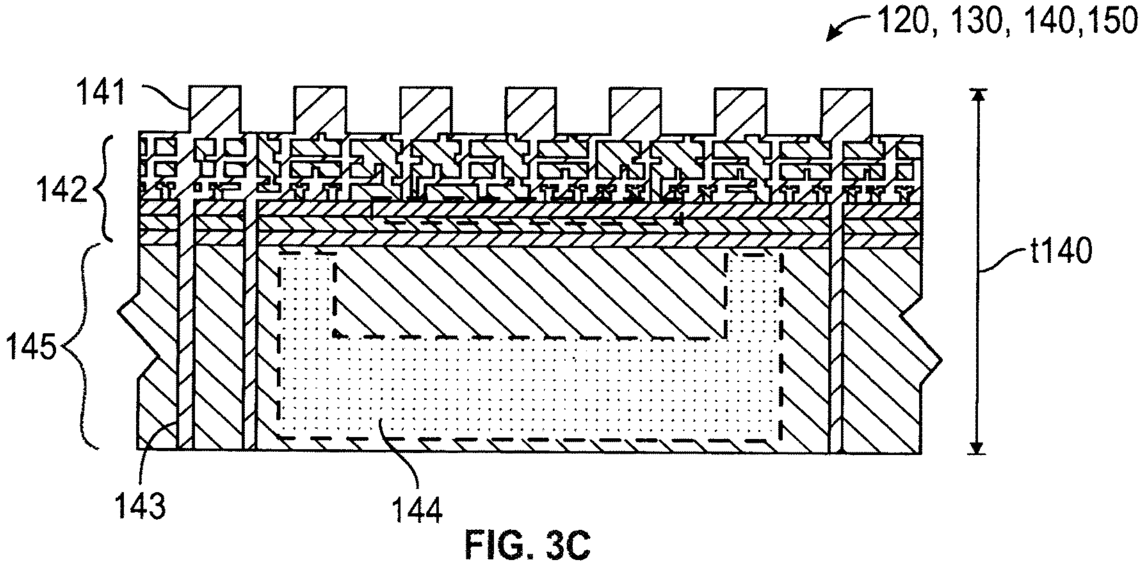

FIG. 3C is a cross-sectional view of one of the active layers 120-150 shown in FIG. 2. In other words, the layer shown in FIG. 3C may represent any one or more of the active layers 120-150 and may be applied to any one or more of the active layers 120-150 shown in, for example, FIG. 2. FIG. 3C will be used to describe aspects and features of any one of the active layers 120-150 that include an embedded thermal isolator 144. For convenience, FIG. 3C will be described with reference to the DSP layer 140, but it should be understood that the same description is applicable to any of the other active layers 120-150.

Referring to FIG. 3C, the DSP layer 140 may include metal pillars 141, semiconductor and metallization layers 142, through substrate vias 143 extending through a substrate 145, and the embedded thermal isolator 144 in the substrate 145. The metal pillars 141 may be similar to the metal pillars 121, described above, the semiconductor and metallization layers 142 may be similar to the semiconductor and metallization layers 122, described above, and the through substrate vias 143 may be similar to the through substrate vias 123, described above. Further, the thickness t140 of the DSP layer 140 may be in a range of about 20 μm to about 150 μm.

The embedded thermal isolator 144 may be an aerogel material, such as silica aerogel. To form the embedded thermal isolator 144, the DSP layer 140 (or the memory layer 150, when the embedded thermal isolator 154 is formed therein) may be etched, such as by using deep reactive ion etching (DRIE), to form a cavity (e.g., to form vertical and lateral gaps) in the silicon layer. Then, the gaps are filled with an aerogel precursor solution, which is cured into a gel, that is chemically bonded to the exposed walls of the silicon layer. The gel is then transformed into a highly porous solid by using a $CO_2$ critical-point dryer to form an aerogel in-place. In some embodiments, the exposed walls may be treated (e.g., pretreated) with alkoxysilanes to form a strong bond to the aerogel. In some embodiments, silica xerogels, which are ambient dried instead of supercritical $CO_2$ dried, and metal organic frameworks (MOFs) may be used instead of the silica aerogel. The embedded thermal isolator 144 protects the components in the DSP layer 140, such as the semiconductor elements, from heat generated in the other active layers 120-140. Similarly, the embedded thermal isolator 154 protects the components in the memory layer 150, such as the memory dies from heat generated in the other active layers 120-140. The memory dies may be susceptible to higher heat and insulating them from the heat generated in the other active layers 120-140 can improve RF front end performance and lifespan.

However, the active layers 120-150 are not limited to including either the embedded heat spreader 124 or the embedded thermal isolator 144. In other embodiments, one or more of the active layers 120-150 may include both the embedded heat spreader 124 and the embedded thermal isolator 144. For example, the embedded heat spreader 124 and the embedded thermal isolator 144 may be arranged laterally adjacent to each other, or one of the embedded heat spreader 124 and the embedded thermal isolator 144 may extend around a periphery of the other one, or they may be formed in island patterns within a layer.

Figure 7:
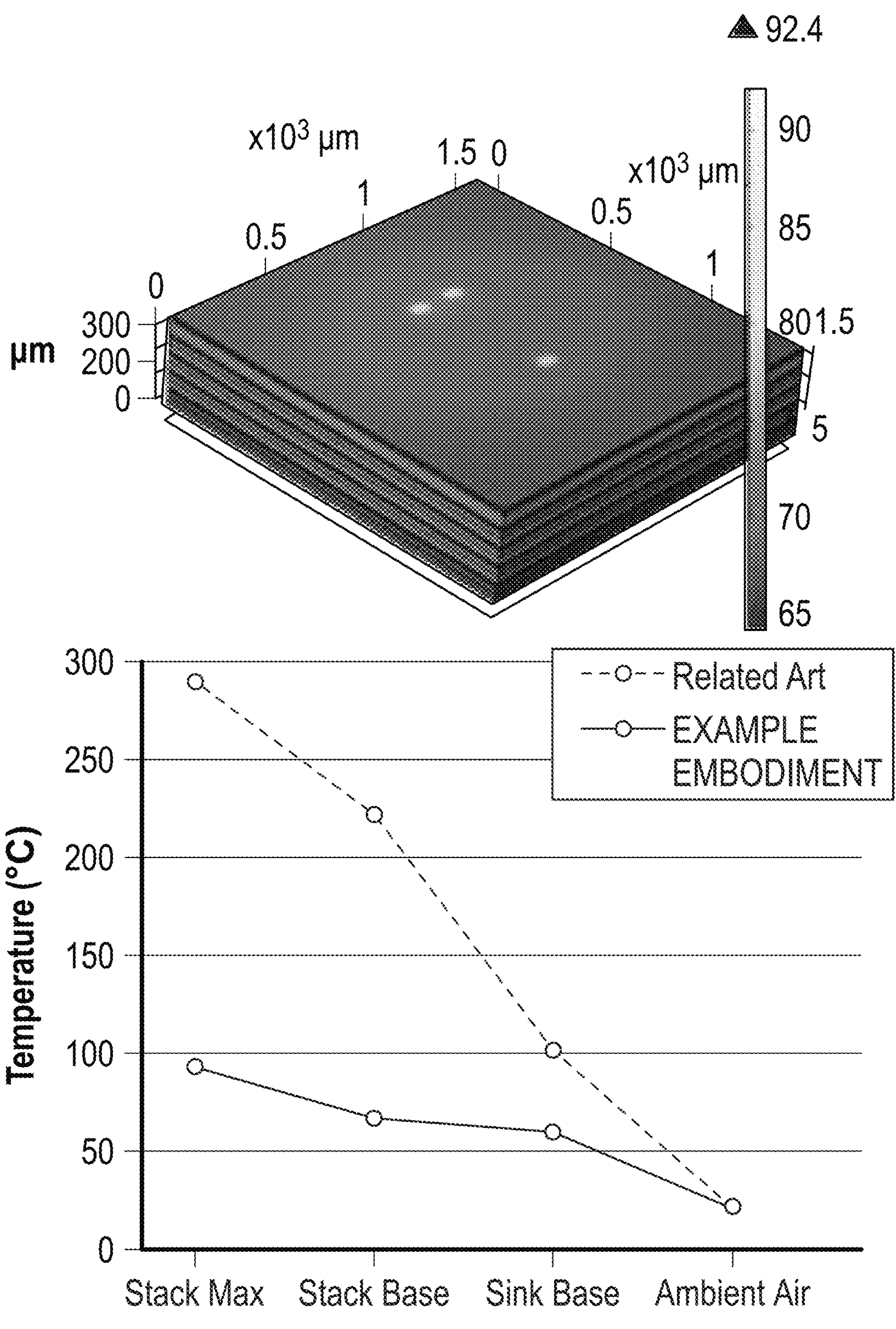
FIG. 7 is a finite element analysis result showing thermal resistance values of an RF front end comparing an embodiment of the present disclosure with a related art example.

FIG. 7 is a finite element analysis result showing thermal resistance values of an RF front end comparing an embodiment of the present disclosure with a related art example. In more detail, FIG. 7 shows a finite element analysis of a five layer (or five tier) 3DHI component with 18 kW/cm$^2$ hot spots in the power semiconductor layer and 4 kW/cm$^2$ hot spots in the beam forming IC layer. As can be seen in FIG. 7, the Example Embodiment of the present disclosure is modeled to outperform the related art 3DHI cooling technique. In particular, the maximum temperature of the 3DHI stack is about 93° C. in the Example Embodiment while the related art 3DHI cooling technique results in a maximum temperature of about 290° C. under the same conditions.

Thus, it can be seen that the Example Embodiment described herein improves cooling of the 3DHI stack by orders of magnitude over related art cooling techniques while providing other benefits, such as thinner layers resulting in a thinner stack and lower latency.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of" and "any one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing embodiments of the present disclosure and is not intended to be limiting of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Although example embodiments of a three-dimensional heterogeneous integrated (3DHI) package and a radio frequency (RF) front end have been described and illustrated herein, many modifications and variations within those embodiments will be apparent to those skilled in the art. Accordingly, it is to be understood that a 3DHI package and a RF front end according to embodiments of the present disclosure may be embodied in forms other than as described herein without departing from the spirit and scope of the present disclosure. The present disclosure is defined by the following claims and equivalents thereof.

What is claimed is:

1. A radio frequency (RF) front end comprising:

a plurality of electrically interconnected active layers stacked on each other; and an antenna on an upper surface of the active layers, the antenna comprising a plurality of antenna elements on an upper surface thereof to form a phased array antenna, the antenna elements being electrically connected to the active layers via coaxial RF feeds, wherein the antenna comprises a plurality of microchannels in a microchannel layer and a RF dielectric layer between the antenna elements and the microchannel layer, the coaxial RF feeds extending through the microchannel layer.

2. The RF front end of claim 1, wherein surfaces of the microchannels are coated with a metal.

3. The RF front end of claim 1, wherein the antenna further comprises an RF shielding layer that surrounds a periphery of the coaxial RF feeds.

4. The RF front end of claim 1, further comprising a cooling block on a lower surface of the active layer and having a plurality of microchannels therein.

5. The RF front end of claim 4, wherein the microchannels in the antenna are in fluid communication with the microchannels in the cooling block via interlayer passages, the interlayer passages extend along the active layers and are closed from the active layers.

6. The RF front end of claim 1, wherein the active layers comprise:

a power amplifier layer; and a beam forming layer, wherein at least one of the active layers comprises an embedded heat spreader and at least another one of the active layers comprises an embedded thermal isolator.

7. The RF front end of claim 6, wherein the embedded heat spreader comprises one or more metals from among copper, tungsten, and molybdenum, one or more high thermal conductivity components from among diamond, silicon carbide, boron nitride, aluminum nitride, silicon, graphite, graphene, carbon nanotubes, boron nitride nanotubes, or a copper-molybdenum-diamond composite material.

8. The RF front end of claim 6, wherein the embedded thermal isolator comprises an aerogel.

9. The RF front end of claim 6, wherein the active layers further comprise a digital signal processing layer and a memory layer.

* * * * *